(12) United States Patent
Carothers et al.

(10) Patent No.: US 9,312,164 B2
(45) Date of Patent: Apr. 12, 2016

(54) LOCALIZED REGION OF ISOLATED SILICON OVER DIELECTRIC MESA

(71) Applicant: Texas Instruments Incorporated, Dallas, TX (US)

(72) Inventors: Daniel Nelson Carothers, Lucas, TX (US); Jeffrey R. Debord, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/301,827

(22) Filed: Jun. 11, 2014

(65) Prior Publication Data

US 2015/0294895 A1  Oct. 15, 2015

Related U.S. Application Data

(60) Provisional application No. 61/978,936, filed on Apr. 13, 2014.

(51) Int. Cl.
| | |
|---|---|
| *H01L 21/00* | (2006.01) |
| *H01L 21/762* | (2006.01) |
| *H01L 21/02* | (2006.01) |
| *H01L 21/306* | (2006.01) |

(52) U.S. Cl.
CPC .......... *H01L 21/762* (2013.01); *H01L 21/0223* (2013.01); *H01L 21/02164* (2013.01); *H01L 21/02178* (2013.01); *H01L 21/02647* (2013.01); *H01L 21/02667* (2013.01); *H01L 21/30625* (2013.01); *H01L 21/0262* (2013.01); *H01L 21/02255* (2013.01); *H01L 21/02532* (2013.01); *H01L 21/02636* (2013.01)

(58) Field of Classification Search
CPC ............... H01L 21/02532; H01L 21/02636; H01L 21/02639; H01L 21/02647; H01L 21/76879; H01L 21/02645; H01L 21/02664; H01L 21/02667; H01L 29/66287; H01L 21/762; H01L 21/30625
USPC .......... 438/481, 479, 486, 489; 257/E21.131
See application file for complete search history.

(56) References Cited

U.S. PATENT DOCUMENTS

| | | | | |
|---|---|---|---|---|
| 4,497,683 | A * | 2/1985 | Celler et al. | 117/44 |
| 4,923,826 | A * | 5/1990 | Jastrzebski et al. | 438/154 |
| 5,618,741 | A * | 4/1997 | Young et al. | 438/151 |
| 6,827,629 | B2 * | 12/2004 | Kim et al. | 451/5 |
| 6,919,238 | B2 * | 7/2005 | Bohr | 438/166 |
| 7,842,564 | B2 * | 11/2010 | Mizushima et al. | 438/166 |
| 2011/0065264 | A1 * | 3/2011 | Moffatt et al. | 438/487 |

* cited by examiner

*Primary Examiner* — Michael Trinh
(74) *Attorney, Agent, or Firm* — John R. Pessetto; Frank D. Cimino

(57) ABSTRACT

An integrated circuit is formed by forming an isolation mesa over a single crystal substrate which includes silicon, and forming a first epitaxial layer on the substrate by a selective epitaxial process so that a top surface of the first epitaxial layer is coplanar with the top surface of the isolation mesa. A non-selective epitaxial process forms single-crystalline silicon-based semiconductor material on the first epitaxial layer and non-crystalline silicon-based material on the isolation mesa. A cap layer is formed over the second epitaxial layer, and a radiantly-induced recrystallization process causes the non-crystalline silicon-based material to form single-crystalline semiconductor over the isolation mesa.

22 Claims, 11 Drawing Sheets

LOCALIZED REGION OF ISOLATED SILICON OVER DIELECTRIC MESA

CROSS-REFERENCE TO RELATED APPLICATIONS

This application claims the benefit of priority under U.S.C. §119(e) of U.S. Provisional Application 61/978,936, filed Apr. 13, 2014, which is hereby incorporated by reference in its entirety.

FIELD OF THE INVENTION

This invention relates to the field of integrated circuits. More particularly, this invention relates to dielectric isolation layers in integrated circuits.

BACKGROUND OF THE INVENTION

An integrated circuit with some circuits or components in dielectrically isolated silicon may be formed on a silicon-on-insulator (SOI) wafer. SOI wafers are more expensive than bulk and epitaxial wafers, undesirably increasing the cost of the integrated circuit. Methods to form buried layers of silicon dioxide such as implanting oxygen have been problematic with respect to providing desired lateral and vertical dimension control of the buried oxide layer, and undesirably increase stress on the wafer, leading to problems during photolithographic operations. Forming thin layers of device quality silicon over buried oxide layers has also been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed by forming an isolation mesa of dielectric material over a single crystal substrate which includes silicon, and performing a selective epitaxial process which forms a first epitaxial layer of silicon-based semiconductor material on the substrate adjacent to the isolation mesa, so that a top surface of the first epitaxial layer is substantially coplanar with a top surface of isolation mesa. A non-selective epitaxial process forms a second epitaxial layer of silicon-based semiconductor material on the first epitaxial layer and isolation mesa, in which the second epitaxial layer is single-crystalline on the first epitaxial layer and is non-crystalline on the isolation mesa. A cap layer is formed over the second epitaxial layer, and a radiantly-induced recrystallization process causes the non-crystalline material to form single-crystalline semiconductor over the isolation mesa.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The following co-pending patent applications are related and hereby incorporated by reference in their entirety: U.S. patent application Ser. No. 14/301,765; U.S. patent application Ser. No. 14/301,788; and U.S. patent application Ser. No. 14/301,848. With their mention in this section, these patent applications are not admitted to be prior art with respect to the present invention.

An integrated circuit may be formed by forming an isolation mesa of dielectric material over a single crystal substrate which includes silicon, and performing a selective epitaxial process which forms a first epitaxial layer of silicon-based semiconductor material on the substrate adjacent to the isolation mesa, so that a top surface of the first epitaxial layer is substantially coplanar with a top surface of isolation mesa. A non-selective epitaxial process forms a second epitaxial layer of silicon-based semiconductor material on the first epitaxial layer and isolation mesa, in which the second epitaxial layer is single-crystalline on the first epitaxial layer and is non-crystalline on the isolation mesa. A cap layer is formed over the second epitaxial layer, and a radiantly-induced recrystallization process causes the non-crystalline material to form single-crystalline semiconductor over the isolation mesa. The cap layer may be removed after the recrystallization step, and the top surface of the epitaxial layer may be planarized, and possibly subsequently thinned.

Figure 1A:
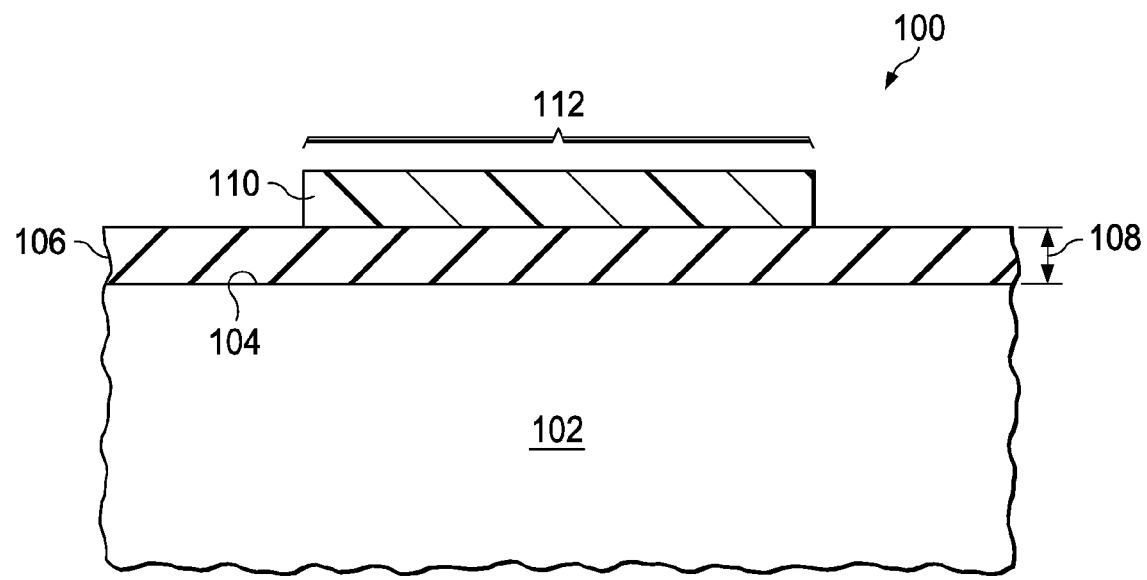
FIG. 1a through FIG. 1L are cross sections of an integrated circuit formed according to an example process sequence.

FIG. 1a through FIG. 1L are cross sections of an integrated circuit formed according to an example process sequence. Referring to FIG. 1A, the integrated circuit 100 is formed on a substrate 102 which has silicon-based single crystal semiconductor material extending to a top surface 104 of the substrate 102. The silicon-based single crystal semiconductor material may be, for example, a single crystal silicon of a bulk silicon wafer, or a silicon epitaxial layer, or a silicon-germanium semiconductor material.

A layer of isolation dielectric material 106 is formed over the top surface 104 of the substrate 102. The layer of isolation dielectric material 106 may include one or more layers of dielectric material, including, for example, silicon dioxide, silicon nitride, silicon oxynitride, aluminum oxide, and/or low-k dielectric material such as organo-silicate glass (OSG), carbon-doped silicon oxides (SiCO or CDO) or silicon dioxide-based dielectric formed from methylsilsesquioxane (MSQ). The layer of isolation dielectric material 106 may be formed, for example, by a thermal oxidation process, a plasma enhanced chemical vapor deposition (PECVD) process, a low pressure chemical vapor deposition (LPCVD) process, a high density plasma (HDP) process, a physical vapor deposition (PVD) process, and/or a reactive sputtering process. A thickness 108 of the layer of isolation dielectric material 106 may be, for example, 100 nanometers to 500 nanometers thick.

A mesa mask 110 is formed over the layer of isolation dielectric material 106 so as to cover an area for an isolated silicon layer 112 and expose the layer of isolation dielectric material 106 adjacent to the area for the isolated silicon layer 112. The mesa mask 110 may include photoresist formed by a photolithographic process, and/or an anti-reflection layer such as a bottom anti-reflection coating (BARC) and/or a layer of hard mask material such as amorphous carbon.

Figure 1B:
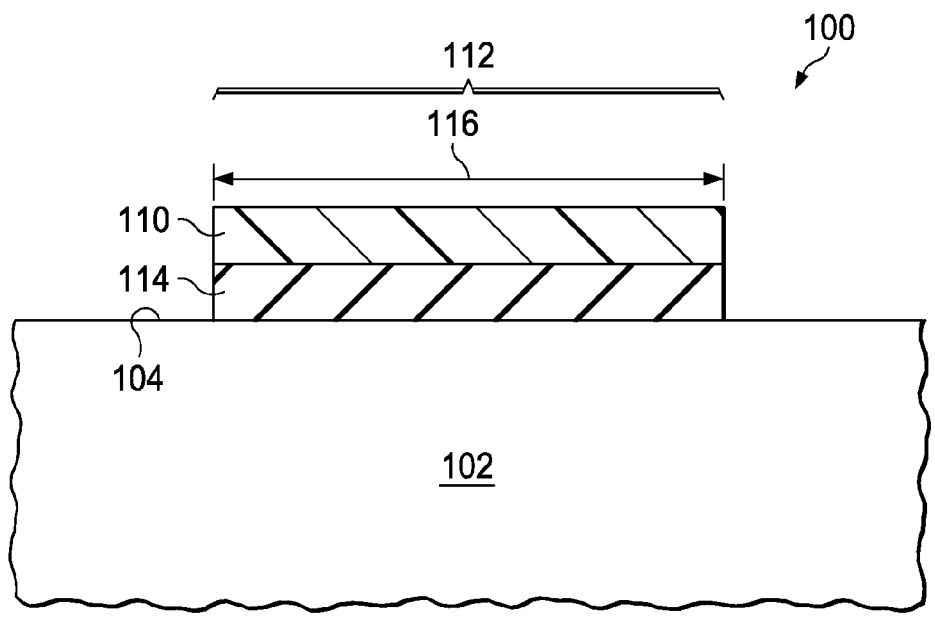

Referring to FIG. 1B, a mesa etch process removes the isolation dielectric material 106 of FIG. 1A in areas exposed by the mesa mask 110, leaving the isolation dielectric material 106 under the mesa mask 110 to form an isolation mesa 114. The mesa etch process may be a reactive ion etch (RIE) process or a timed wet etch process. A width 116 of the isolation mesa 114 may be 100 nanometers to 100 microns. The mesa mask 110 is removed, for example by an ash process followed by a wet clean step using an aqueous mixture of sulfuric acid and hydrogen peroxide, or a dilute aqueous mixture of ammonium hydroxide and hydrogen peroxide.

Figure 1C:
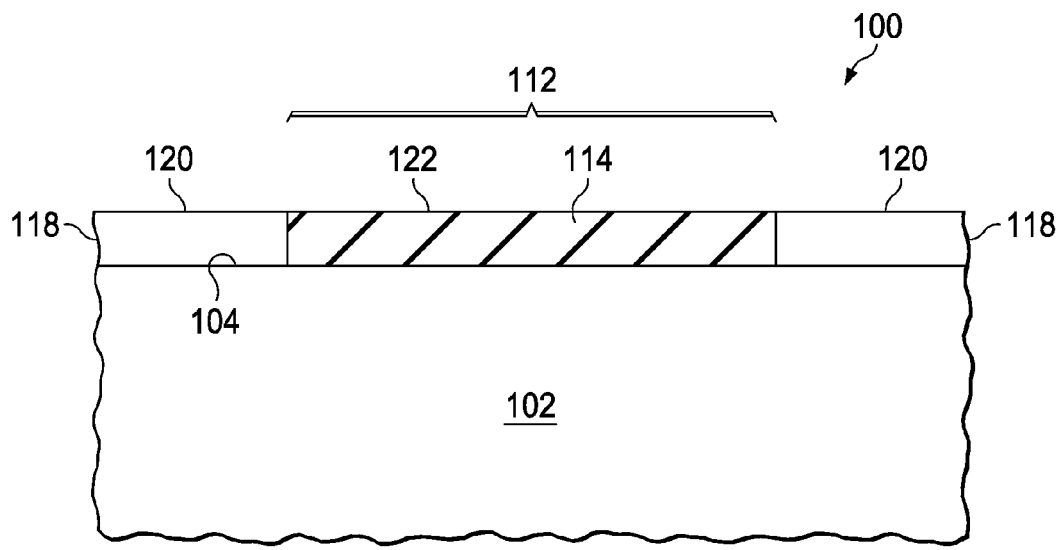

Referring to FIG. 1C, a selective epitaxial process forms a first epitaxial layer 118 of single-crystalline silicon-based semiconductor material on exposed areas of the substrate 102, including adjacent to the isolation mesa 114. The selective epitaxial process may start with an in situ clean process such as the Applied Materials Siconi™ clean process, to remove any native oxide from the top surface 104 of the substrate 102. The selective epitaxial process may provide dichlorosilane ($SiH_2Cl_2$) gas at 100 standard cubic centimeters per minute (sccm) to 300 sccm and hydrogen chloride (HCl) gas at 100 sccm to 300 sccm at a pressure of 10 torr to 100 torr with the substrate 102 at a temperature of 700° C. to 900° C., which may provide a growth rate of 5 nanometers per minute to 50 nanometers per minute. A top surface 120 of the first epitaxial layer 118 adjacent to the isolation mesa 114 is substantially coplanar with the top surface 122 of the isolation mesa 114.

Figure 1D:
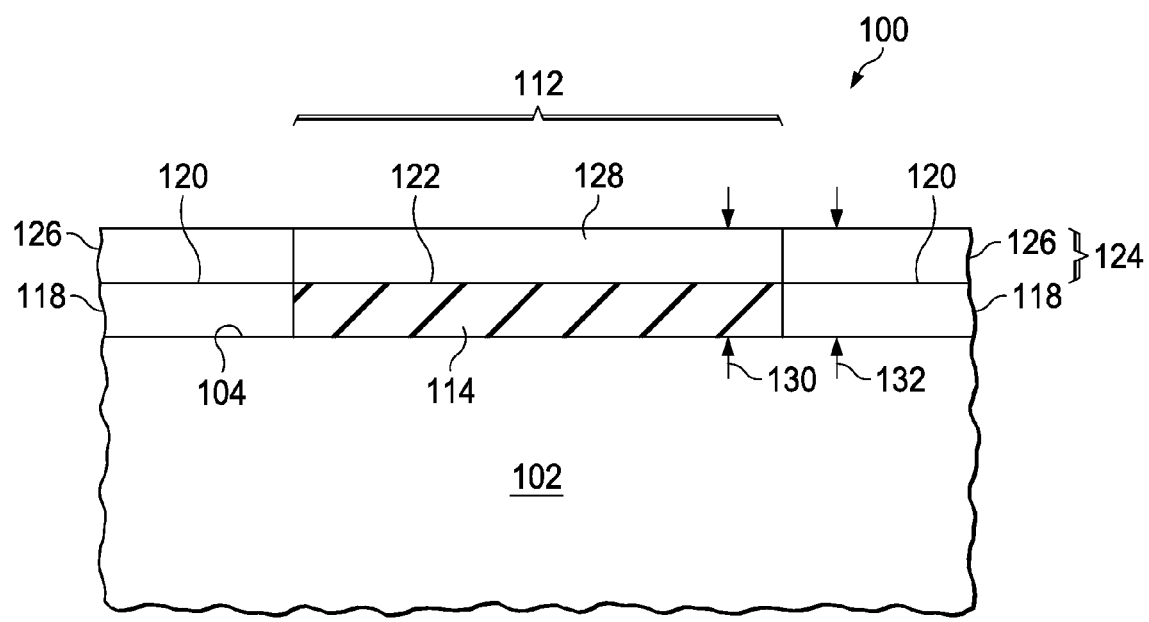

Referring to FIG. 1D, a non-selective epitaxial process forms a second epitaxial layer 124 of silicon-based semiconductor material on a top surface 120 of the first epitaxial layer 118 and a top surface 122 of the isolation mesa 114. The second epitaxial layer 124 includes a single-crystalline region 126 on the first epitaxial layer 118 and a non-crystalline region 128 on the isolation mesa 114 laterally contacting the single-crystalline region 126. The non-crystalline region 128 may be polycrystalline or amorphous. A thickness 130 of the non-crystalline region 128 may be 50 nanometers to 200 nanometers thicker than a desired final thickness of a single-crystalline layer over the isolation mesa 114. For example, the thickness 130 of the non-crystalline region 128 may be 125 nanometers for a final desired thickness of 75 nanometers for the single-crystalline layer over the isolation mesa 114. A thickness 132 of the single-crystalline region 126 may be substantially equal to the thickness 130 of the non-crystalline region 128 as depicted in FIG. 1D, or may be greater than the thickness 130 of the non-crystalline region 128. The non-selective epitaxial process may provide silane ($SiH_4$) and/or disilane ($Si_2H_6$) at 20 sccm to 200 sccm at a pressure of 10 torr to 100 torr and a temperature of 500° C. to 700° C., which may provide a growth rate of 5 nanometers per minute to 50 nanometers per minute. Alternatively, the non-selective epitaxial process may provide trisilane ($Si_3H_8$) at 20 milligrams per minute to 250 milligrams per minute at a pressure of 10 torr to 100 torr and a temperature of 400° C. to 650° C. The second epitaxial layer 124 may be grown at a higher rate using trisilane than using silane and disilane at a same temperature, or the second epitaxial layer 124 may be grown at a rate equivalent to the silane/disilane rate at a lower temperature. In some versions of the instant example, the gases provided to the substrate 102 by the non-selective epitaxial process during formation of the second epitaxial layer 124 may be substantially free of chlorine-containing gas, which may form the single-crystalline region 126 and the non-crystalline region 128 with substantially the same thicknesses 132 and 130, respectively. In other versions, the gases provided to the substrate 102 during formation of the second epitaxial layer 124 may be include some chlorine-containing gas, which may form the single-crystalline region 126 thicker, for example 20 percent thicker, than the non-crystalline region 128. For example, the non-selective epitaxial process may provide dichlorosilane with hydrogen ($H_2$) at a pressure of 20 torr to 100 torr and a temperature of 1080° C. to 1120° C., which may provide a growth rate of 500 nanometers per minute to 2 microns per minute. Alternatively, the non-selective epitaxial process may provide trichlorosilane ($SiHCl_3$) with hydrogen at a pressure of 500 torr to 760 torr and a temperature of 1115° C. to 1200° C., which may provide a growth rate of 3.5 microns per minute to 4 microns per minute.

Figure 1E:
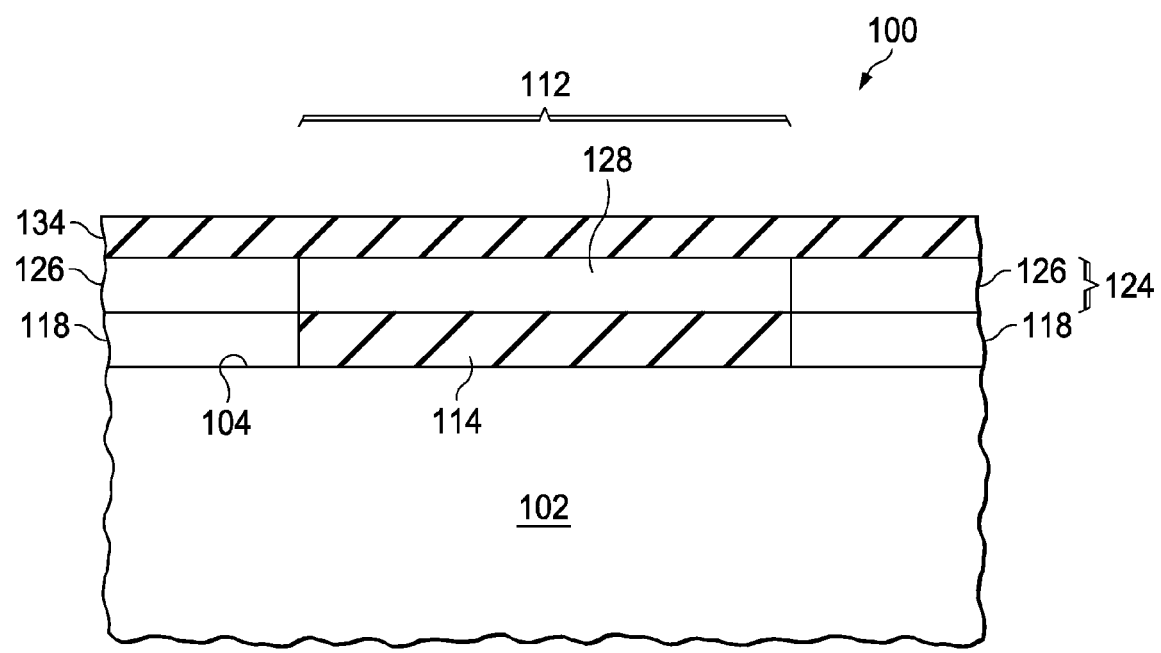

Referring to FIG. 1E, a cap layer 134 is formed over the second epitaxial layer 124. The cap layer 134 may include one or more layers of silicon dioxide, silicon nitride and/or silicon oxynitride. The cap layer 134 may be 50 nanometers to 200 nanometers thick, and may be formed by a PECVD process using tetraethyl orthosilicate, also known as tetraethoxysilane (TEOS) for silicon dioxide and bis (tertiary-butylamino) silane (BTBAS) for silicon nitride.

Figure 1F:
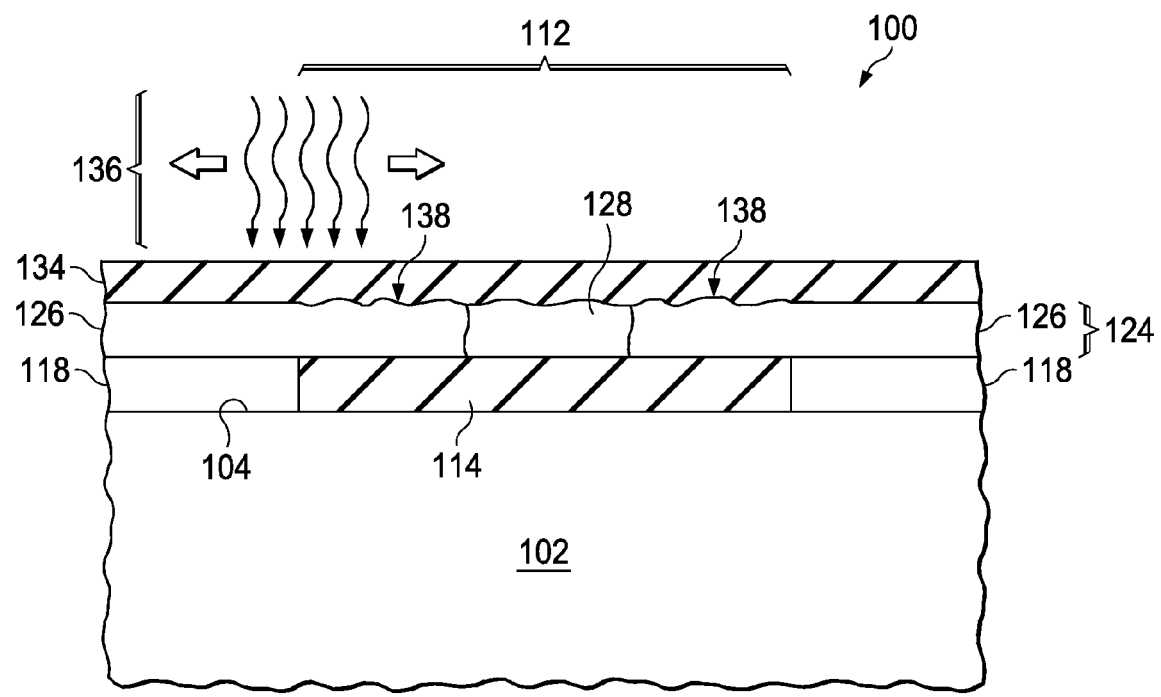

Referring to FIG. 1F, a radiantly-induced recrystallization process 136 heats the non-crystalline region 128 to a higher temperature than the single-crystalline region 126 of the second epitaxial layer 124 so that the non-crystalline region 128 recrystallizes so as to extend the single-crystalline region 126 over the isolation mesa 114. FIG. 1F depicts the radiantly-induced recrystallization process 136 partway to completion. The radiantly-induced recrystallization process 136 may raise the temperature of the non-crystalline region 128 above its melting point. The radiantly-induced recrystallization process 136 may produce a roughened interface 138 between cap layer 134 and the newly recrystallized portion of the single-crystalline region 126 over the isolation mesa 114. The radiantly-induced recrystallization process 136 may include, for example, a scanned laser anneal process 136, as depicted schematically in FIG. 1F. Alternatively, the radiantly-induced recrystallization process 136 may be a flash lamp anneal process, or other radiant process which provides energy to the non-crystalline region 128 from a radiant source in any part of the electromagnetic spectrum. Forming the second epitaxial layer 124 to have the single-crystalline region 126 above the first epitaxial layer 118 and laterally abutting the non-crystalline region 128 may enable the newly recrystallized portion of the single-crystalline region 126 over the isolation mesa 114 to form with fewer defects than an epitaxial layer without a single-crystalline region laterally abutting a non-crystalline region.

Figure 1G:
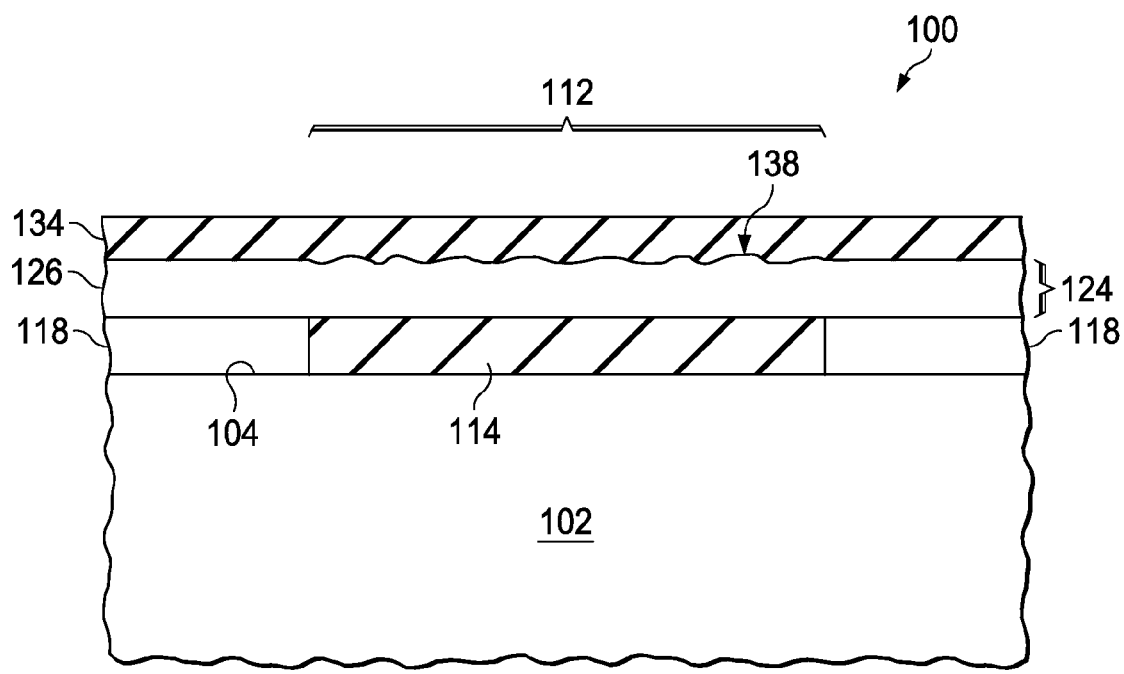

FIG. 1G shows the integrated circuit 100 after the radiantly-induced recrystallization process 136 of FIG. 1F is completed. The single-crystalline region 126 of the second epitaxial layer 124 extends across the isolation mesa 114.

Figure 1H:
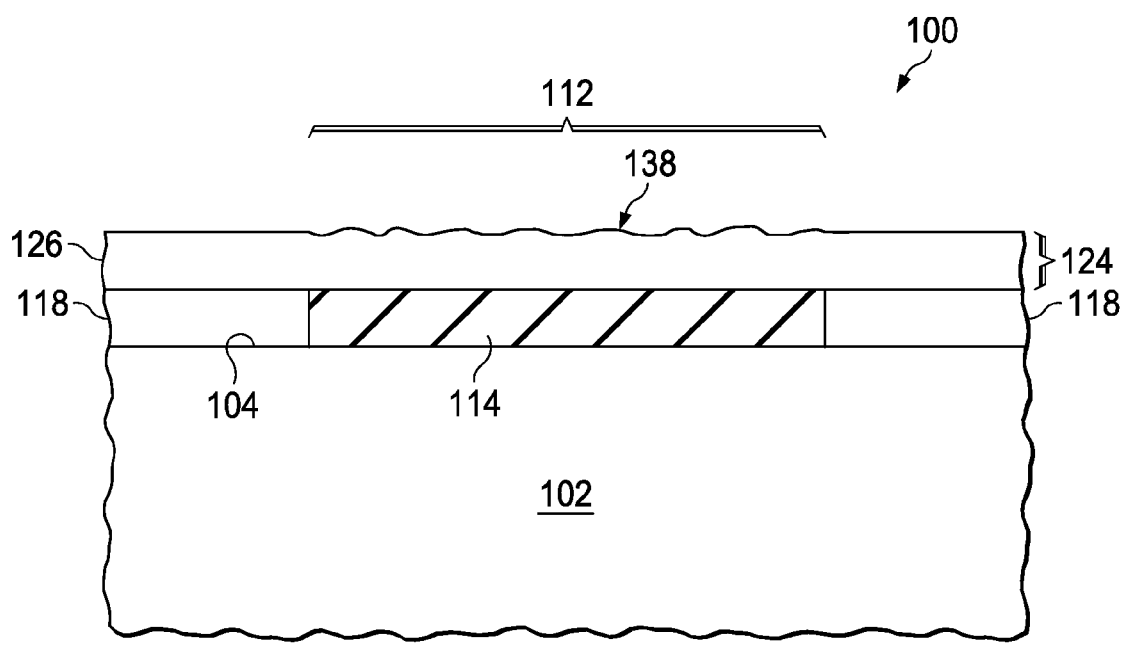

Referring to FIG. 1H, the cap layer 134 of FIG. 1G is removed without removing a significant portion of the single-crystalline region 126. The cap layer 134 may be removed by a plasma etch, or be a wet etch using a dilute buffered aqueous solution of hydrofluoric acid.

Figure 1I:
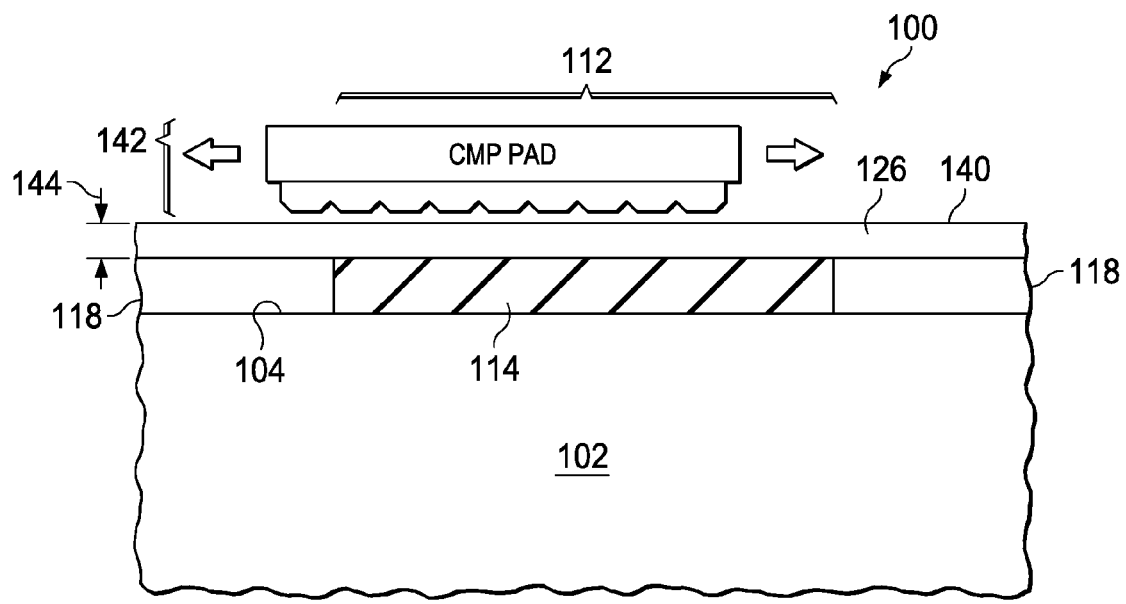

Referring to FIG. 1I, the single-crystalline region 126 is planarized to provide a smooth top surface 140 of the single-crystalline region 126 extending over the substrate 102 and the isolation mesa 114. The single-crystalline region 126 may be planarized by a CMP process 142, depicted in FIG. 1I by a CMP Pad 142. Alternatively, the single-crystalline region 126 may be planarized by another method, such as a resist etchback process. The single-crystalline region 126 may possibly be planarized to a thickness 144 which may be suitable for forming components over the isolation mesa 114. Alternatively, the planarization process 142 may be performed to obtain a desired flatness and smoothness of the top surface 140, and the single-crystalline region 126 may be subsequently thinned by another method, for example as described in reference to FIG. 1J through FIG. 1L.

Figure 1J:
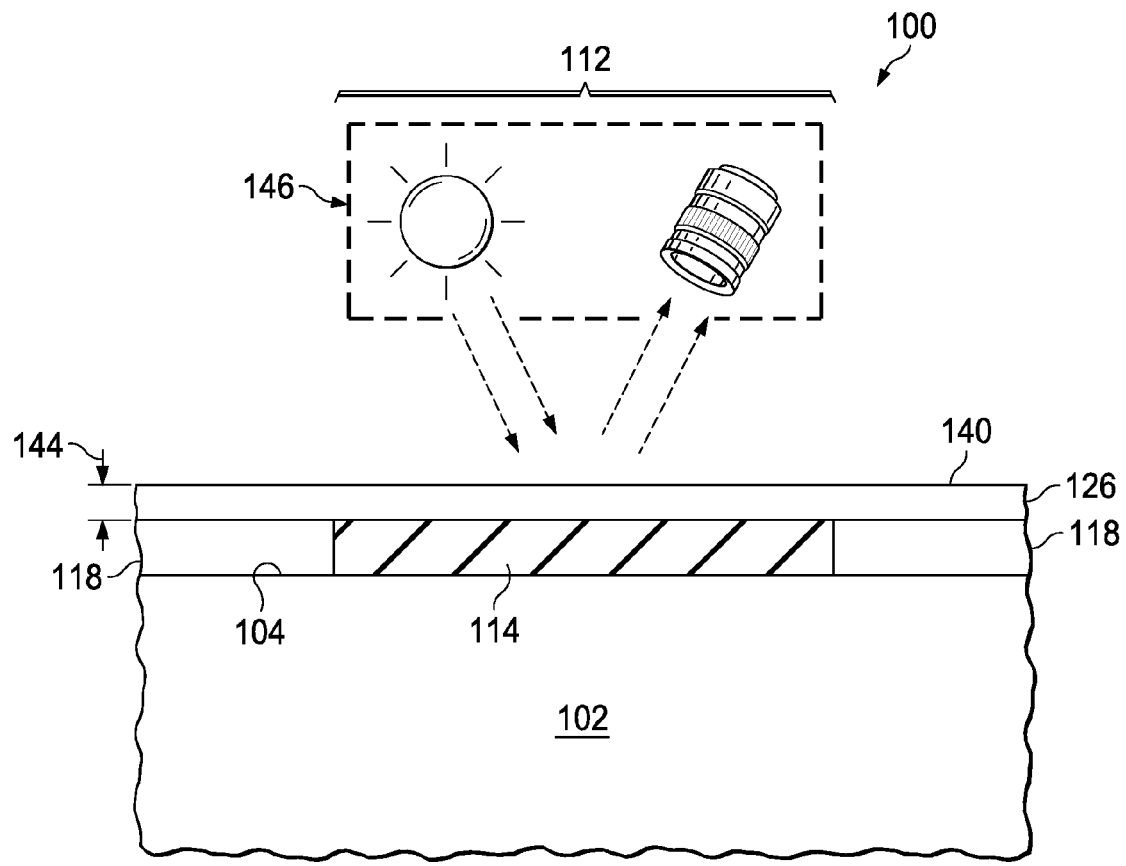

Referring to FIG. 1J, the thickness 144 of the planarized single-crystalline region 126 over the isolation mesa 114 may optionally be measured. The thickness 144 may be measured, for example, by an optical reflectometer instrument 146 as depicted schematically in FIG. 1J. Other methods of measuring the thickness 144 of the planarized single-crystalline region 126 over the isolation mesa 114 are within the scope of the instant example. The measured thickness may be compared to a desired thickness to estimate an amount of the single-crystalline region 126 to be subsequently removed.

Figure 1K:
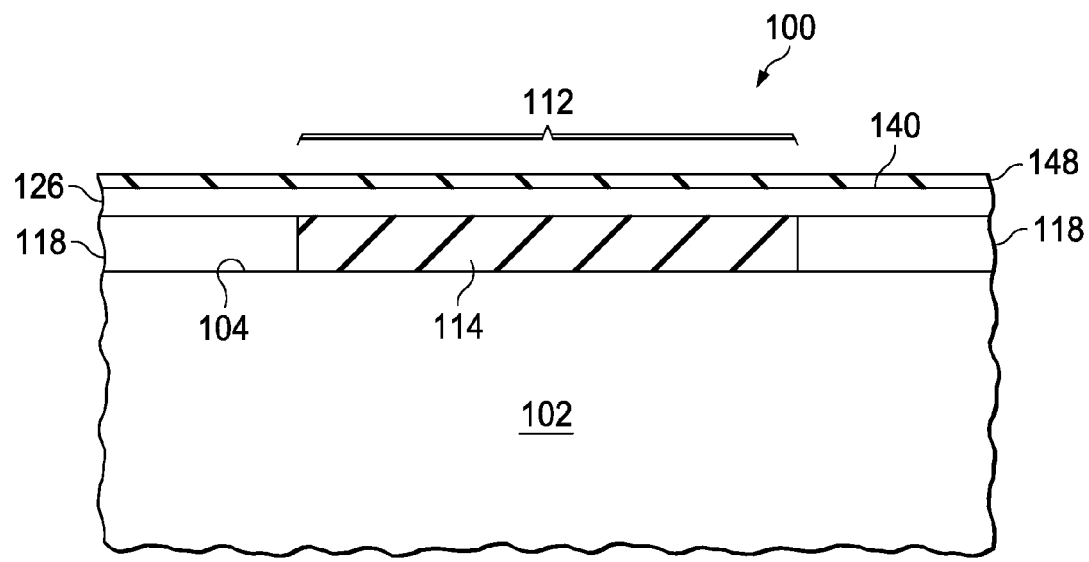

Referring to FIG. 1K, a thermal oxidation process may be used to consume a desired thickness of the single-crystalline region 126 at the top surface 140, forming a layer of thermal oxide 148 on the single-crystalline region 126. Consuming the desired thickness of the single-crystalline region 126 using the thermal oxidation process may advantageously consume a uniform amount of the single-crystalline region 126 across the integrated circuit 100. Other methods of consuming the desired thickness of the single-crystalline region 126, such as a CMP process or a timed blanket etch process, are within the scope of the instant example.

Figure 1L:
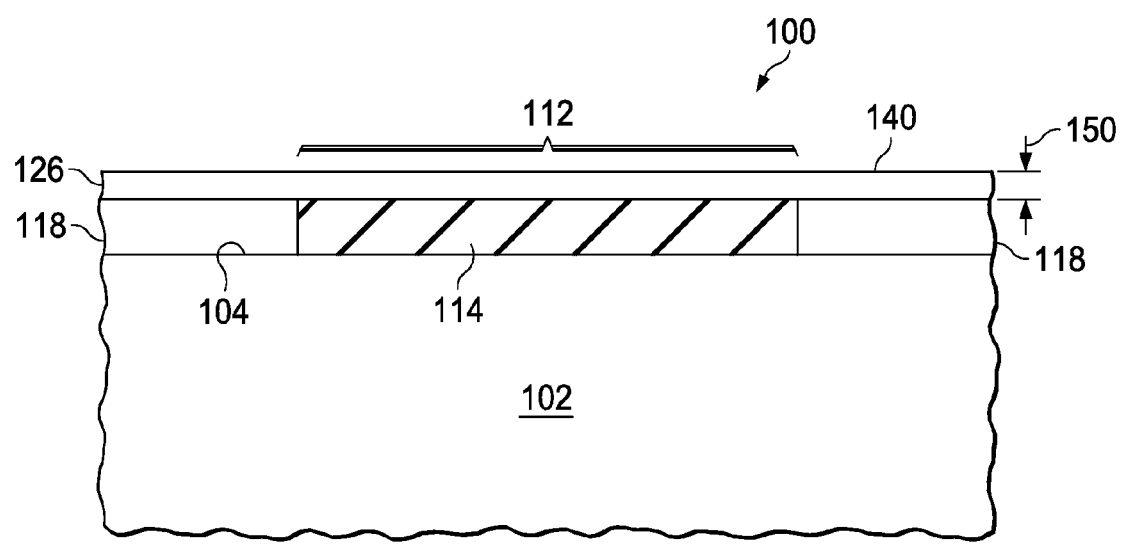

Referring to FIG. 1L, the layer of thermal oxide 148 of FIG. 1K on the single-crystalline region 126 is removed, leaving the single-crystalline region 126 having a final thickness 150 over the isolation mesa 114. The layer of thermal oxide 148 may be removed by a plasma etch process, selective to the single-crystalline region 126 and endpointed at the top surface 140 of the single-crystalline region 126. Alternatively, the layer of thermal oxide 148 may be removed by a timed wet etch process using a buffered diluted aqueous solution of hydrofluoric acid. The single-crystalline region 126 over the isolation mesa 114 provides the isolated silicon layer 112. The final thickness 150 may be less than or equal to 100 nanometers, for example 75 nanometers to 100 nanometers. Components such as transistors may subsequently be formed in the leaving the single-crystalline region 126 over the isolation mesa 114, advantageously having a low capacitance to the substrate 102.

Figure 2A:
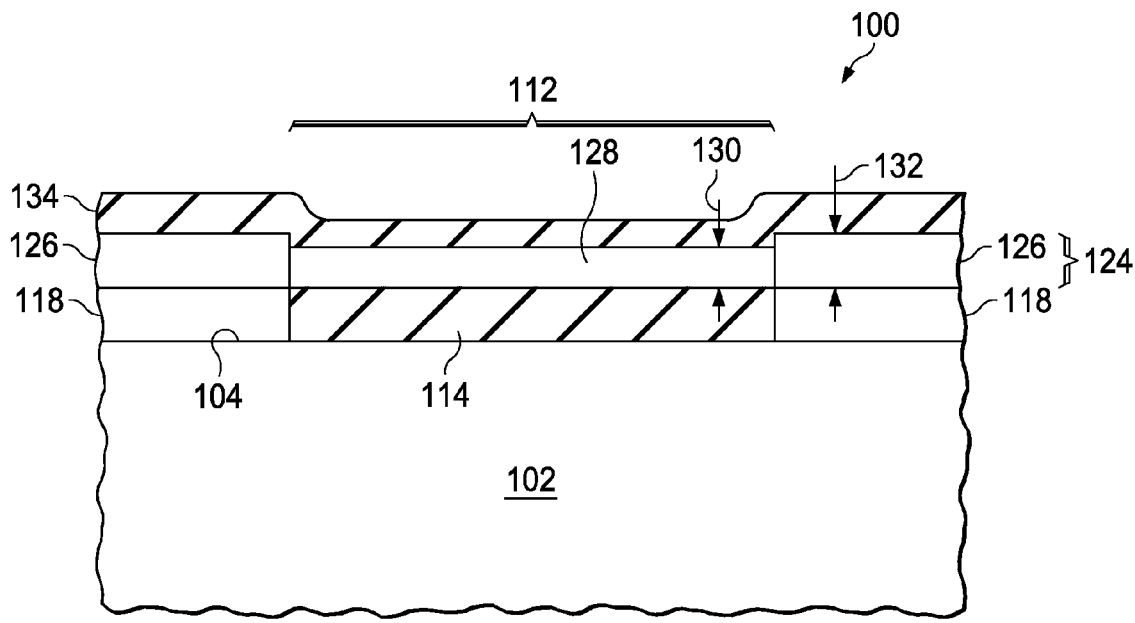
FIG. 2A through FIG. 2C are cross sections of the integrated circuit of FIG. 1A through FIG. 1L, depicting an alternate method for the radiantly-induced recrystallization process.
Figure 2B:
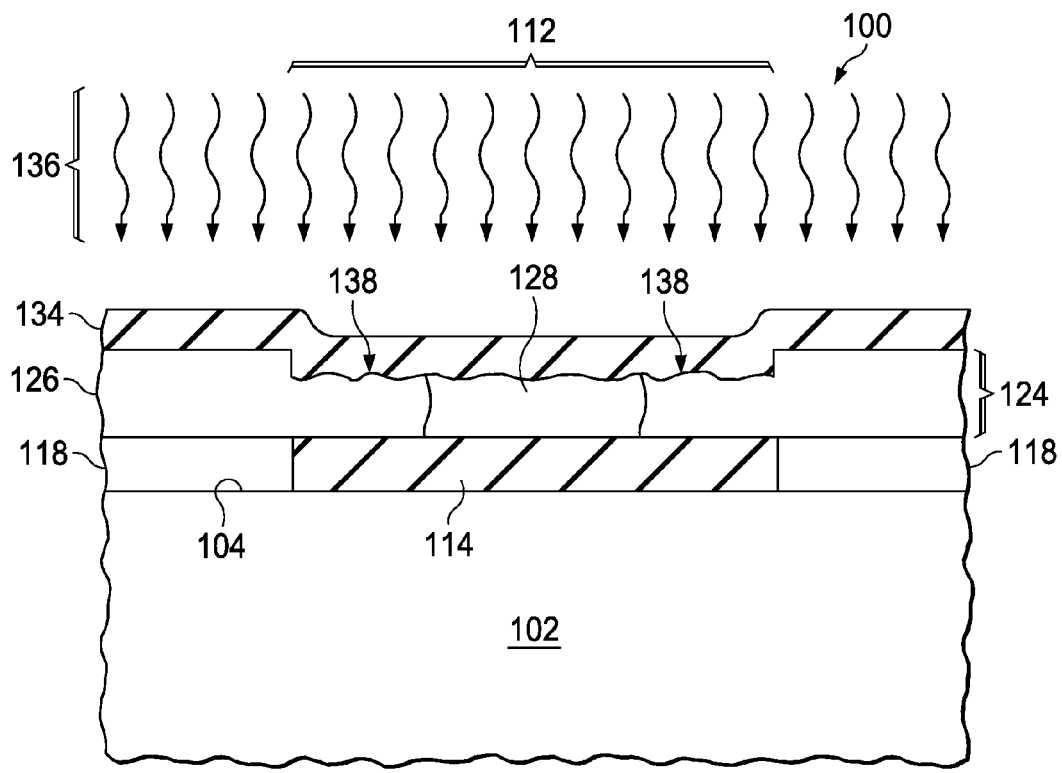
Figure 2C:
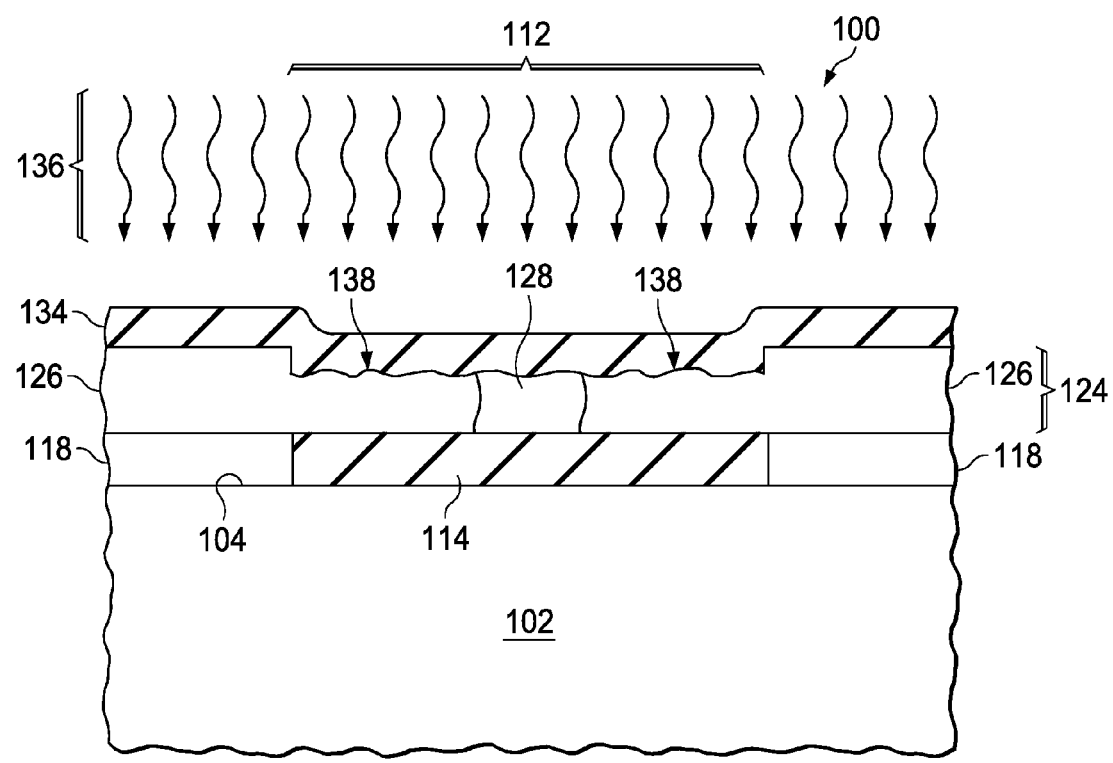

FIG. 2A through FIG. 2C are cross sections of the integrated circuit of FIG. 1A through FIG. 1L, depicting an alternate method for the radiantly-induced recrystallization process. Referring to FIG. 2A, the second epitaxial layer 124 is formed over the substrate 102 and the isolation mesa 114. In the instant example, the thickness 132 of the single-crystalline region 126 may be greater than the thickness 130 of the non-crystalline region 128, as depicted in FIG. 2A. The cap layer 134 is formed over the second epitaxial layer 124.

Referring to FIG. 2B, in the instant example, the radiantly-induced recrystallization process 136 is a flash lamp anneal process 136 which irradiates substantially all of the second epitaxial layer 124 concurrently. The flash lamp anneal process 136 includes one or more flash irradiation steps which provide the radiant energy for less than a millisecond. FIG. 2B depicts the flash lamp anneal process 136 partway to completion. The non-crystalline region 128 may be melted by the flash lamp anneal process 136 while the single-crystalline region 126 is not melted.

FIG. 2C depicts the integrated circuit 100 as the flash lamp anneal process 136 is nearer to completion, for example after a second flash irradiation step. The non-crystalline region 128 continues to recrystallize, adding to the single-crystalline region 126. After the flash lamp anneal process 136 is completed, the non-crystalline region 128 will have completely recrystallized, so that the single-crystalline region 126 of the second epitaxial layer 124 extends across the isolation mesa 114. Formation of the integrated circuit 100 proceeds as described in reference to FIG. 1g et seq.

Figure 3A:
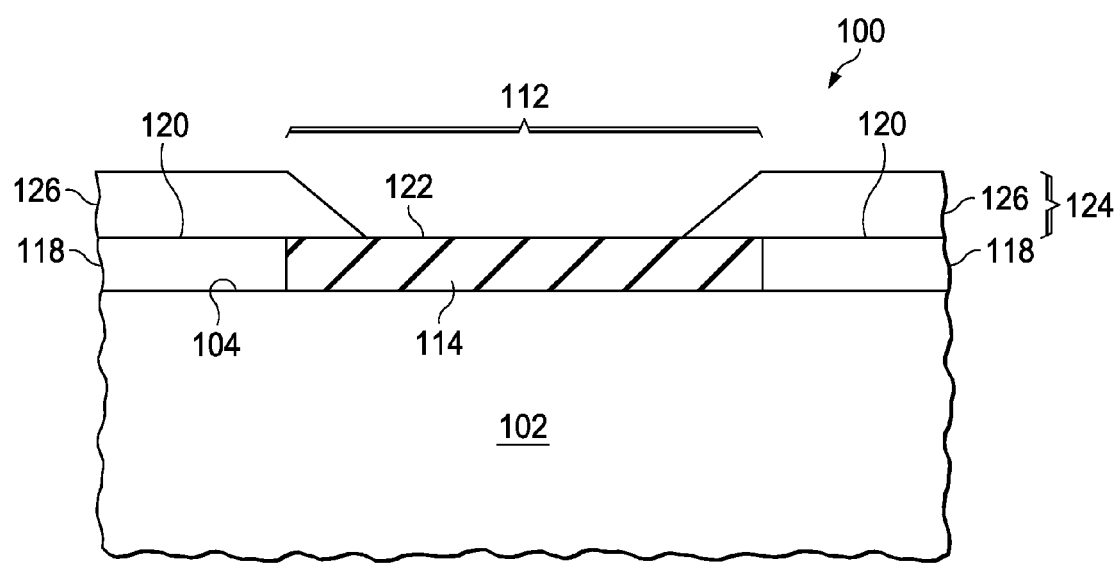
FIG. 3A through FIG. 3E are cross sections of the integrated circuit of FIG. 1A through FIG. 1L, depicting another method for the radiantly-induced recrystallization process.

FIG. 3A through FIG. 3E are cross sections of the integrated circuit of FIG. 1A through FIG. 1L, depicting another method for the radiantly-induced recrystallization process. Referring to FIG. 3A, the second epitaxial layer 124 is formed over the substrate 102 and partially overlapping the isolation mesa 114. In the instant example, the second epitaxial layer 124 includes the single crystalline region 126 which has a tapered profile over the isolation mesa 114. A center portion of the top surface 122 of the isolation mesa 114 is substantially free of the single-crystalline region 126.

Figure 3B:
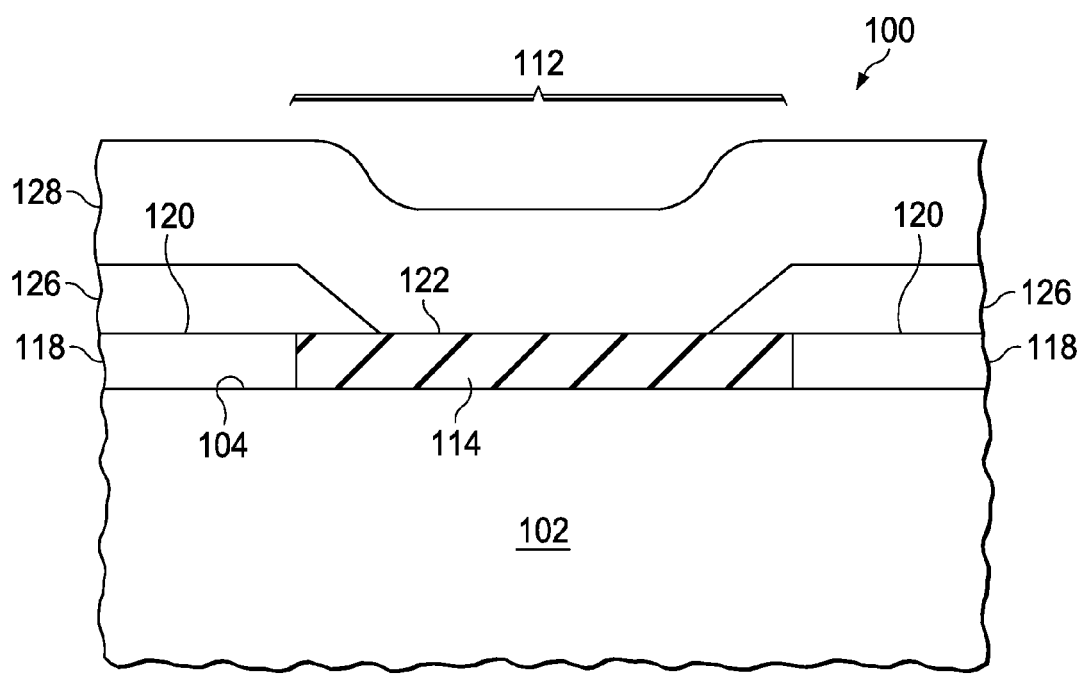

Referring to FIG. 3B, the non-crystalline region 128 is formed on the single-crystalline region 126 and on the isolation mesa 114 as a layer of polycrystalline silicon 128, referred to as the layer of polysilicon 128. The non-crystalline region 128 may be substantially conformal, as depicted in FIG. 3B.

Figure 3C:
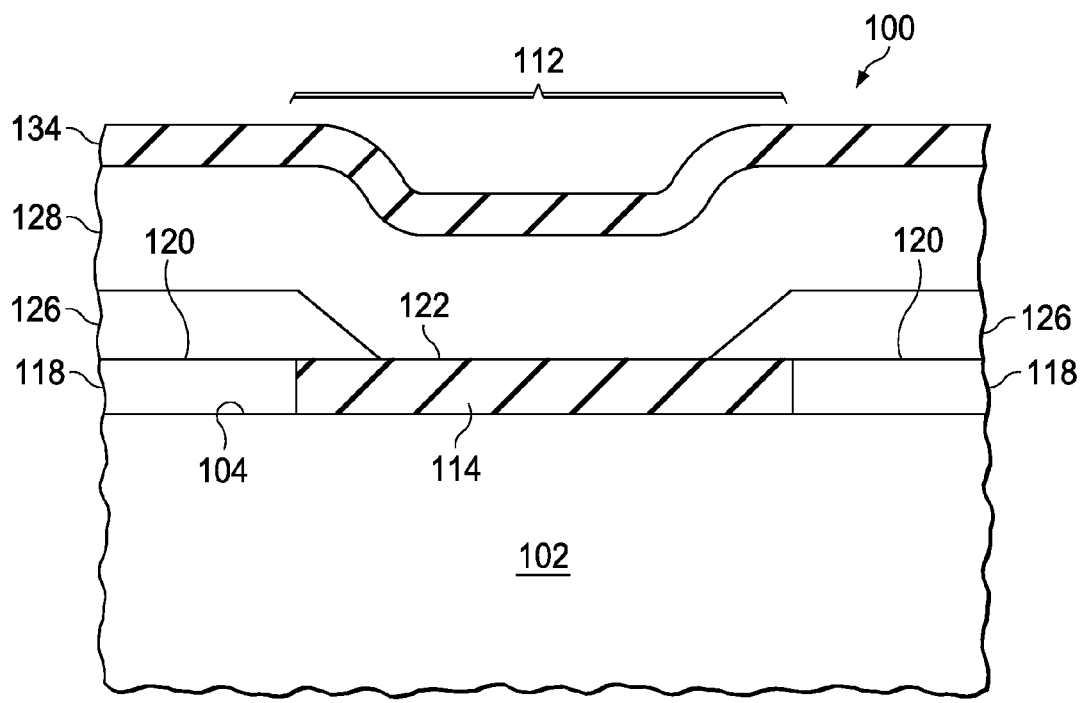

Referring to FIG. 3C, the cap layer 134 is formed over the second epitaxial layer 126, in this example, on the non-crystalline region 128. The cap layer may be formed as described in reference to FIG. 1E.

Figure 3D:
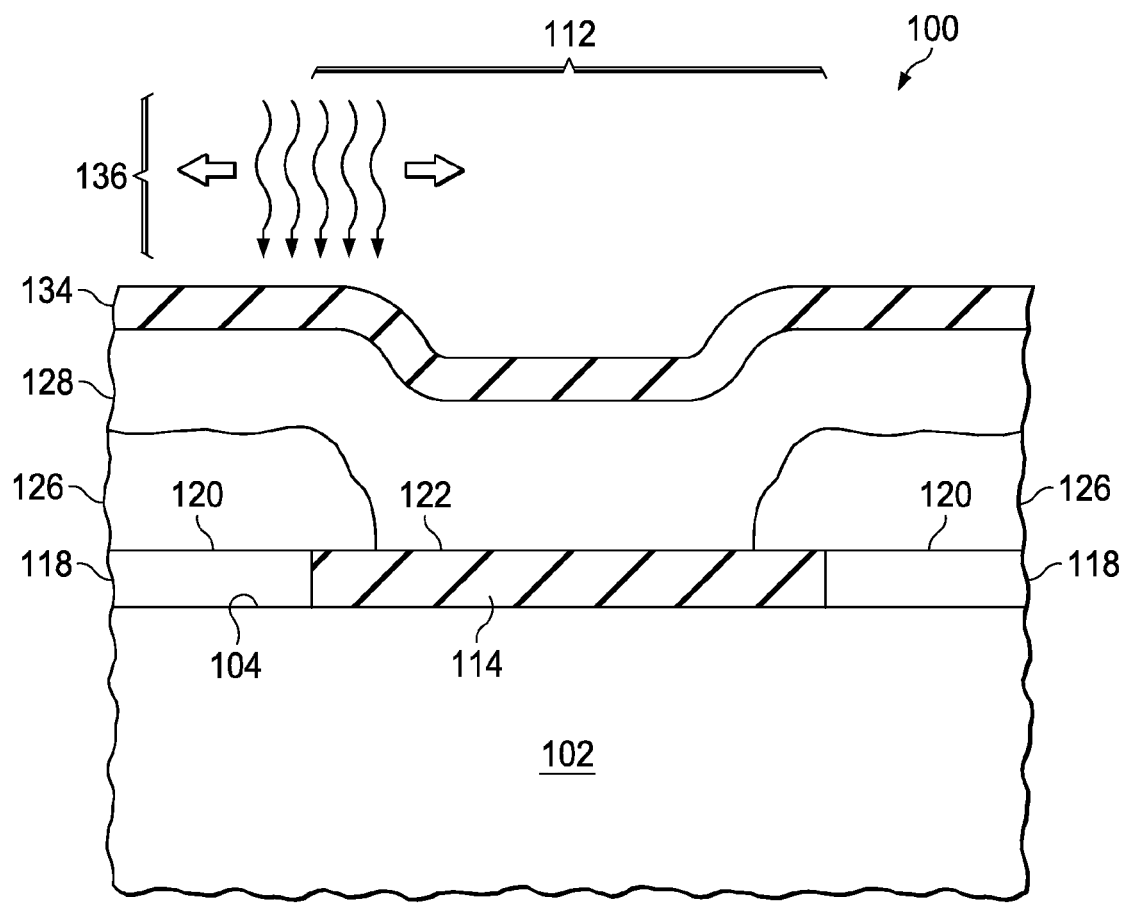

Referring to FIG. 3D, the radiantly-induced recrystallization process 136 is performed which heats the non-crystalline region 128 to a higher temperature than the single-crystalline region 126 so that the non-crystalline region 128 recrystallizes so as to extend the single-crystalline region 126 over the isolation mesa 114. FIG. 3D depicts the radiantly-induced recrystallization process 136 soon after the non-crystalline region 128 starts to recrystallize.

Figure 3E:
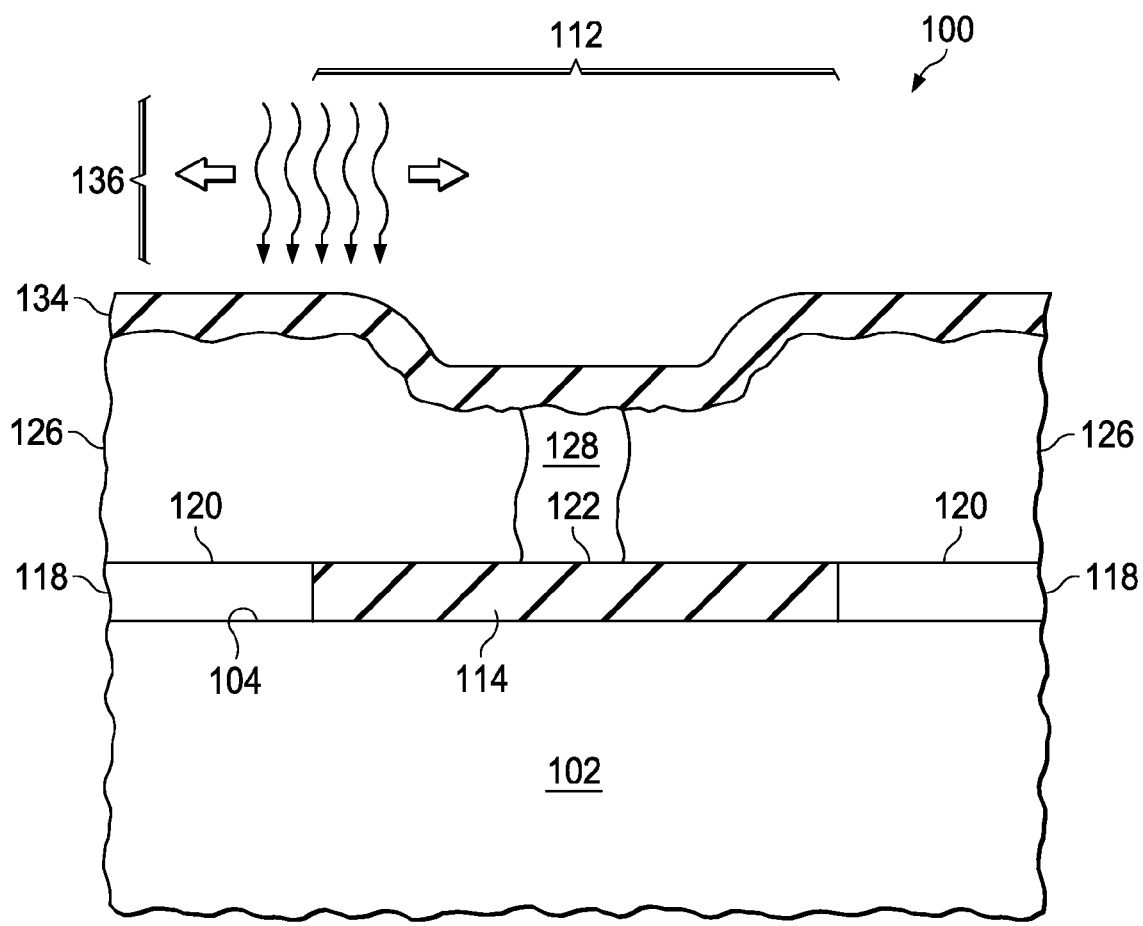

Referring to FIG. 3E, the radiantly-induced recrystallization process 136 continues so that the non-crystalline region 128 reduces in area as the single-crystalline region 126 extends further over the isolation mesa 114. After the radiantly-induced recrystallization process 136 is completed, the non-crystalline region 128 will have completely recrystallized, so that the single-crystalline region 126 of the second epitaxial layer 124 extends across the isolation mesa 114. Formation of the integrated circuit 100 proceeds as described in reference to FIG. 1G et seq.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming an integrated circuit, comprising the steps:
   providing a substrate comprising silicon based single crystal semiconductor material extending to a top surface of the substrate; forming an isolation mesa over the substrate;
   forming a first epitaxial layer of single crystalline silicon based semiconductor material on exposed areas of the substrate adjacent to the isolation mesa by a selective epitaxial process, so that a top surface of the first epitaxial layer adjacent to the isolation mesa is substantially coplanar with the top surface of the isolation mesa;
   forming a second epitaxial layer of silicon based semiconductor material on the top surface of the first epitaxial layer and on only less than all of the top surface of the isolation mesa so that the second epitaxial layer includes a single crystalline region on the first epitaxial layer and partially overlapping the isolation mesa;
   forming a further layer of non crystalline silicon based semiconductor material on a top surface of the second epitaxial layer and on an exposed portion of the top surface of the isolation mesa so that the further layer covers said exposed portion and laterally contacts the single crystalline region; and
   heating the further layer by a radiantly induced recrystallization process so that the non crystalline material recrystallizes so as to extend the single crystalline region completely over the isolation mesa.

2. The method of claim 1, further comprising removing a top portion of the single crystalline region over the isolation mesa.

3. The method of claim 2, wherein the top portion of the single crystalline region over the isolation mesa is removed by consuming the top portion of the single crystalline region by a thermal oxidation process to form a layer of thermal oxide on the single crystalline region, followed by removing the layer of thermal oxide.

4. The method of claim 1, wherein a final thickness of the single crystalline region over the isolation mesa is 75 nanometers to 100 nanometers.

5. The method of claim 1, wherein the isolation mesa comprises primarily silicon dioxide.

6. The method of claim 1, wherein the isolation mesa comprises primarily aluminum oxide.

7. The method of claim 1, wherein the isolation mesa has a thickness of 100 nanometers to 500 nanometers.

8. The method of claim 1, wherein the radiant induced recrystallization process includes a scanned laser anneal process.

9. The method of claim 1, wherein the radiant induced recrystallization process includes a flash lamp anneal process.

10. The method of claim 1, comprising:
    forming a cap layer over the further layer prior to the step of heating the further layer by the radiantly induced recrystallization process; and
    removing the cap layer after the step of heating the further layer by the radiantly induced recrystallization process.

11. The method of claim 10, wherein the cap layer includes silicon dioxide.

12. The method of claim 1, wherein the step of forming the first epitaxial layer is performed so that gases provided to the substrate include dichlorosilane gas and hydrogen chloride gas.

13. The method of claim 1, wherein the step of forming the second epitaxial layer is performed so that gases provided to the substrate are substantially free of chlorine containing gas.

14. The method of claim 1, wherein the second epitaxial layer has a tapered profile overlapping the isolation mesa.

15. The method of claim 1, wherein the step of forming the first epitaxial layer is performed so that gases provided to the substrate during formation of the first epitaxial layer include dichlorosilane gas.

16. The method of claim 1, comprising planarizing a top surface of the single crystalline region over the isolation mesa, after the step of heating the further layer by the radiantly induced recrystallization process.

17. A method of forming an integrated circuit, comprising the steps:
    providing a substrate comprising silicon based single crystal semiconductor material extending to a top surface of the substrate;
    forming a layer of isolation dielectric material over the substrate;
    forming a mesa mask over the layer of isolation dielectric material so as to cover the layer of isolation dielectric material in an area for an isolation mesa;
    removing material from the layer of isolation dielectric material in areas exposed by the mesa mask to form an isolation mesa over the substrate;
    removing the mesa mask;
    forming a first epitaxial layer of single crystalline silicon based semiconductor material on exposed areas of the substrate adjacent to the isolation mesa by a selective epitaxial process, so that a top surface of the first epitaxial layer adjacent to the isolation mesa is substantially coplanar with the top surface of the isolation mesa;
    forming a second epitaxial layer of silicon based semiconductor material on the top surface of the first epitaxial layer and on only less than all of the top surface of the isolation mesa so that the second epitaxial layer includes a single crystalline region on the first epitaxial layer and partially overlapping the isolation mesa;
    forming a further layer of non crystalline silicon based semiconductor material on a top surface of the second epitaxial layer and on an exposed portion of the top surface of the isolation mesa so that the further layer covers said exposed portion and laterally contacts the single crystalline region;
    forming a cap layer comprising silicon dioxide over the further layer;
    heating the further layer by a radiantly induced recrystallization process comprising a scanned laser anneal process so that the non crystalline material recrystallizes so as to extend the single crystalline region completely over the isolation mesa;
    removing the cap layer;
    planarizing a top surface of the single crystalline region over the isolation mesa by a chemical mechanical polish (CMP) process;
    consuming a top portion of the single crystalline region by a thermal oxidation process to form a layer of thermal oxide on the single crystalline region; and
    removing the layer of thermal oxide.

18. The method of claim 17, wherein a final thickness of the single crystalline region over the isolation mesa is 75 nanometers to 100 nanometers.

19. The method of claim 17, wherein the isolation mesa has a thickness of 100 nanometers to 500 nanometers.

20. The method of claim 17, wherein the step of forming the second epitaxial layer is performed so that gases provided to the substrate during formation of the epitaxial layer are substantially free of chlorine containing gas.

21. The method of claim 17, wherein the second epitaxial layer has a tapered profile overlapping the isolation mesa.

22. The method of claim 17, further comprising the step of measuring a thickness of the single crystalline region over the isolation mesa, after the step of planarizing the top surface of the single crystalline region and prior to the step of consuming the top portion of the single crystalline region.

* * * * *